(12) United States Patent
Baker et al.

(10) Patent No.: US 9,847,616 B1
(45) Date of Patent: Dec. 19, 2017

(54) LASER BEAM AMPLIFICATION BY HOMOGENOUS PUMPING OF AN AMPLIFICATION MEDIUM

(71) Applicant: Rofin-Sinar UK Ltd, Kingston Upon Hull (GB)

(72) Inventors: Howard John Baker, Edinburgh (GB); Jason Robert Lee, Kingston Upon Hull (GB); Benjamin Stuart Fulford, Kingston Upon Hull (GB); David James Lewis Birkin, Kingston Upon Hull (GB)

(73) Assignee: ROFIN-SINAR UK LTD. (GB)

( * ) Notice: Subject to any disclaimer, the term of this patent is extended or adjusted under 35 U.S.C. 154(b) by 356 days.

(21) Appl. No.: 14/997,757

(22) Filed: Jan. 18, 2016

(30) Foreign Application Priority Data

Jan. 23, 2015 (GB) .................................. 1501171.1

(51) Int. Cl.
*H01S 3/00* (2006.01)
*H01S 3/094* (2006.01)
(Continued)

(52) U.S. Cl.
CPC .... *H01S 3/094049* (2013.01); *G02B 19/0009* (2013.01); *G02B 19/0057* (2013.01);
(Continued)

(58) Field of Classification Search
CPC . H01S 3/09; H01S 3/091; H01S 3/094; H01S 3/0941
(Continued)

(56) References Cited

U.S. PATENT DOCUMENTS 5,139,609 A * 8/1992 Fields ................. H01S 3/09415
216/2
5,541,951 A 7/1996 Juhasz et al.
(Continued)

FOREIGN PATENT DOCUMENTS

EP 1318578 B1 1/2007
EP 1972043 7/2007
(Continued)

OTHER PUBLICATIONS

Intellectual Property Office (GB) Search report for GB1501171.1, dated Feb. 20, 2015, entire document.
(Continued)

*Primary Examiner* — Mark Hellner
(74) *Attorney, Agent, or Firm* — Law Office of Jesse D. Lambert, LLC (57) ABSTRACT

Apparatus and method for the amplification of a laser beam by pumping a homogenous composite source beam through an amplification medium. A slab crystalline active medium is side-pumped via a pump module having a laser diode bar and an optical assembly. The optical assembly has a fast axis collimator and a lens in the fast axis and an array of slow axis collimators and the lens in the slow axis. The lenses are spaced so that the individual source beams from the emitters are: imaged upon a first facet of the amplification medium; have a beam waist at or near the first facet; are sized to fill the first facet; substantially overlap on the first facet; and are directed so that peripheral source beams undergo total internal reflection on entering the amplification medium. Embodiments of multiple laser diode bars and optical assemblies are described together with double side pumping arrangements.

25 Claims, 7 Drawing Sheets

(51) Int. Cl.
   H01S 3/0941    (2006.01)
   H01S 3/16      (2006.01)
   G02B 19/00     (2006.01)
   G02B 27/09     (2006.01)
(52) U.S. Cl.
   CPC ........ *G02B 27/0961* (2013.01); *H01S 3/0941* (2013.01); *H01S 3/163* (2013.01); *H01S 3/1685* (2013.01)
(58) Field of Classification Search
   USPC ........................................................ 359/333
   See application file for complete search history.

(56) References Cited

U.S. PATENT DOCUMENTS

| | | | |
|---|---|---|---|
| 6,124,973 A | 9/2000 | Du et al. | |
| 6,351,477 B1 | 2/2002 | Du | |
| 6,738,396 B2 | 5/2004 | Filgas et al. | |
| 6,785,304 B2 | 8/2004 | Filgas | |
| 7,065,121 B2 | 6/2006 | Filgas et al. | |
| 7,639,722 B1 * | 12/2009 | Paxton | G02B 27/0972 359/831 |
| 2002/0122455 A1 | 9/2002 | Knights et al. | |
| 2003/0138021 A1 | 7/2003 | Hodgson et al. | |
| 2005/0069255 A1 | 3/2005 | Nishimura | |
| 2006/0221439 A1 | 10/2006 | Kuhnelt et al. | |
| 2012/0033704 A1 | 2/2012 | Kopf et al. | |

FOREIGN PATENT DOCUMENTS

| | | |
|---|---|---|
| EP | 2889670 A1 | 7/2015 |
| WO | WO 03/005104 A2 | 1/2003 |
| WO | WO 2003/005104 A2 | 1/2003 |
| WO | WO 2007/078456 A1 | 7/2007 |
| WO | WO 2012/033672 A1 | 3/2012 |

OTHER PUBLICATIONS

European Patent Office, European Search Report for EP 16152376, dated Jun. 3, 2016, Munich, Germany.

C L Bonner et al, "Diode-bar end-pumped High-power Nd:Y 3 Al 5 0 12 planar waveguide laser," Optical Society of America OCIS, Jun. 15, 1998, pp. 942-944. XP055277755; URL:https://www.osapublishing.org/fulltext.cfm?uri=ol-23-12-942, pp. 942-944; fig. 1.

C L Bonner: "Multi-Watt, diode pumped planar waveguide lasers," Mar. 1, 2000, pp. 143-166, XP055277724; URL:http://www.orc.soton.ac.uk/. publications/theses/1400T_clb/clb-6.pdf (retrieved by EPO on Jun. 3, 2016), pp. 144-146; fig. 6.1.

J R Leger et al: "Geometrical Transformation of Linear Diode-Laser Amys for Longitudinal Pumping of Solid-State Lasers," IEEE Journal Quantum Electronics, Jan. 1, 1992. XP055277664; URL:http://ieeexplore.ieee.org/iel1/3/3682/00135232.pdf?arnumber=135232; p. 1092; pp. 1089-1099.

* cited by examiner

LASER BEAM AMPLIFICATION BY HOMOGENOUS PUMPING OF AN AMPLIFICATION MEDIUM

BACKGROUND OF THE INVENTION

The present invention relates to an apparatus and method for the amplification of a laser beam by pumping a homogenous composite source beam through an amplification medium.

Lasers with pulse widths of less than 10 ps offer new processing capabilities in micro-machining industrial applications. However, the processing speeds enabling mass manufacture require pulse repetition frequencies of between 100 kHz to 10 MHz, adjustable to an optimal frequency with average powers in excess of 100 W. Typically, such combinations are not achievable with most laser architectures as the maximum pulse energy is limited by non-linear effects and damage to the laser crystal. Thin disk laser oscillators have achieved powers approaching 150 W, being at the lower end of the power range required, but at fixed pulse repetition frequencies of between 3.50 MHz and 60 MHz, being above the required range, and they cannot easily be adjusted to an optimal frequency for a specific process whilst maintaining the average power.

Currently, master oscillator power amplifiers (MOPA's) are used to obtain the high average powers required. In such apparatus a low power laser master oscillator generates pulses of the required width which are coupled into a power amplifier. The input pulse stimulates emission within the amplifier which is added to the input pulse to create a higher output energy pulse. As both the intensity and fluence are significantly lower than would be achieved within an oscillator having a similar output, the apparatus can achieve higher output power and energies before damage occurs. MOPA's are now being implemented in a number of alternative laser architectures.

In each of these arrangements a single solid-state crystalline medium forms the active region of the amplifier which is typically pumped via one or more laser diode bars. A laser diode bar is a linear array of emitters with a fast-axis, which refers to the vertical axis (perpendicular to the semiconductor wafer) where the beam diverges quickly, and a slow-axis, parallel to the face of the bars. The slow axis (x-axis) and the fast axis (y-axis) are perpendicular to each other and orthogonal to the pump axis (z-axis). Correct energy coupling from the emitters to the solid-state laser medium is crucial if the device is to operate efficiently with stable mode and power, prerequisites of any industrial laser system. The coupling technique must ensure near uniform absorption and heating, both transverse to and along the pump axis. In 4 level laser systems such as Nd: YAG, thermally generated refractive index profiles can lead to beam steering, modal distortion and depolarisation. Whereas some of these effects can be reduced by the choice of crystal geometry, such as a thin slab or planar waveguide, they cannot be eliminated entirely. Additionally, in quasi 3 level systems, such as Yb: YAG, a finite lower laser level population at room temperature can lead to unwanted absorbing regions if the crystal is not uniformly pumped.

EP1318578 to Daniel Kopf describes a pumping system for a regenerative amplifier in which a suitable substantially smooth laser diode pump spot is obtained from a laser diode array source or multiple arrays, by imaging each single emitter of the array or the arrays without focusing into substantially the same spot at the laser medium. Due to the absence of focusing a comparatively low aspect ratio diode laser beam is achieved at the surface of the gain medium with a comparatively low intensity of the spot, which prevents thermal damages and other problems caused by higher intensities in the regenerative amplifier setup.

Figure 1:
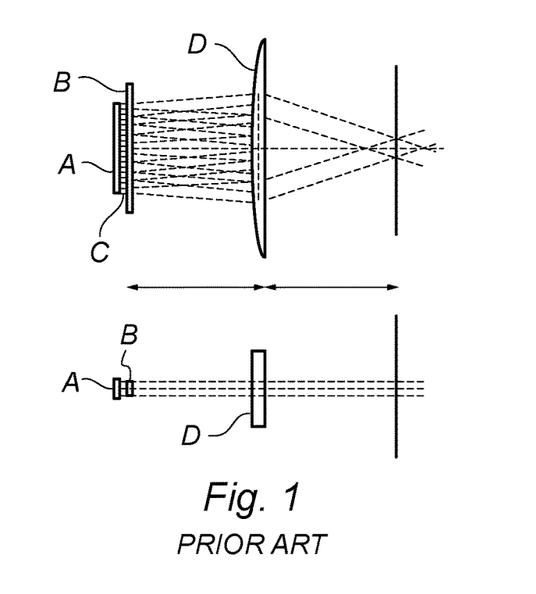
FIG. 1 is an optical arrangement for a diode pumping scheme according to the prior art.

The pump scheme of EP1318578 is as detailed in FIG. 1. In the fast axis of the laser diode bar A, a fast axis collimator B in the form of a cylindrical lens, with focal length, $f_1$, between 0.2-1 mm, is placed a distance $f_1$ from the laser diode emitters C. This acts to collimate the strongly divergent light in the fast axis. In the slow axis, a cylindrical lens D of focal length $f_2$ is placed a distance $\sim f_2$ from the diode emitters C. This lens acts only in the slow axis. It acts to collimate the beam in the slow axis and creates substantial overlap between the beams created by the individual emitters within the array. Alternatively, by shifting the position of the cylindrical lens slightly the beams can be placed adjacent to each other in the slow axis. Importantly, there is no focussing of the beam in the fast axis.

The purpose of this pump scheme is to create a near circular, or low aspect ratio, beam with a smooth profile at the surface of the gain medium for use in a regenerative amplifier with a thin disk active region as compared to thin slab or planar waveguide structures used in MOPA's. The low aspect ratio and profile of the beam are required to prevent unwanted aperturing and non-uniform heating effects. To create a smooth profile the cylindrical lens in the slow axis does not image the beam but creates a far-field profile, the Fourier transform of the near-field, at a focal length, $f_2$, from the lens. A disadvantage of this arrangement is that the gain in the active region is limited and thus complex regenerative amplifiers are required for MOPA's.

It is known that after the pump beam enters the crystal it is absorbed according to the well known Beers Law, $I_{out}=I_{in}\exp(-\alpha z)$, where $I_{out}$ is the remaining beam intensity for an input beam intensity of $I_{in}$ after a propagation distance z through an absorbing medium characterised by an absorption coefficient $\alpha$. To overcome this exponential decay in beam pump intensity, double pumped arrangements have been proposed. A double pumped arrangement is found in the commercially available INNOSLAB amplifier from, for example, EdgeWave GmbH, Germany and shown in FIG. 2. The pump scheme is within the outlined box.

Figure 2:
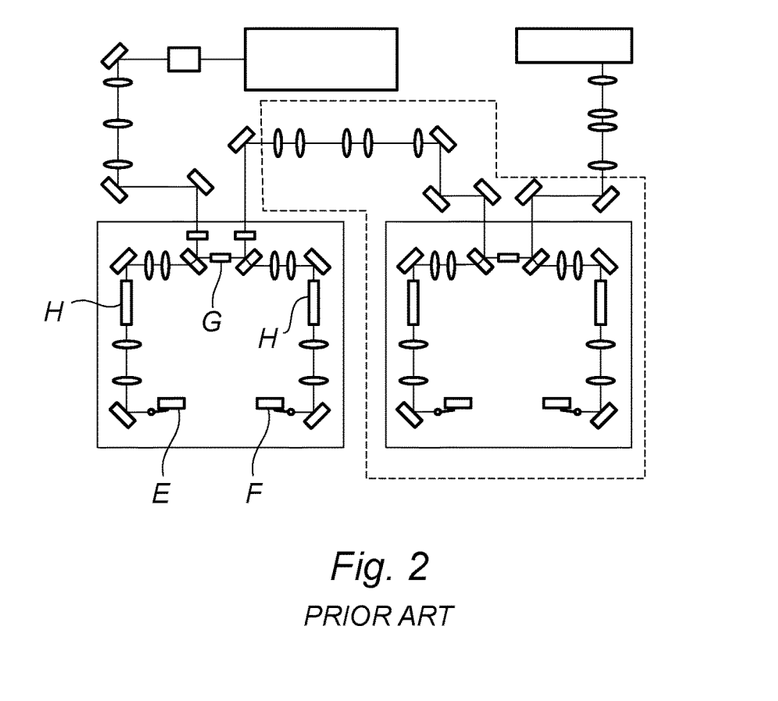
FIG. 2 is an apparatus for amplifying a laser beam according to the prior art.

FIG. 2 shows a twin layout with two planar laser diode bars E, F, each incident upon the laser crystal G through opposing sides with the pump axis being co-linear to the axis of propagation of the amplified or oscillating seed beam. In the fast axis, the beam is imaged directly into the crystal using a telescope with a suitable magnification to generate a pumped stripe height typically between 20% and 50% of the crystal height. In the slow axis, the beam is focussed into a planar waveguide H. The multiple emitter beams are then 'mixed' as they travel along the waveguide, resulting in an output with a more homogenous, or uniform, profile. Using a suitable magnification the homogenised beam is then imaged into the crystal so that the width of the crystal is uniformly pumped.

The main disadvantages of this approach are the complexity of the components and the large footprint of the device which is, typically, 500 mm by 500 mm. The footprint is largely determined by the size and complexity of the pump homogenisation optics and waveguides rather than the crystal or pump diodes themselves. Additionally, as the pump axis is co-linear to the axis of propagation of the seed beam, additional optics are required to redirect the pump beam and seed beam relative to each other.

BRIEF SUMMARY OF THE INVENTION

An object of the present invention is to provide apparatus and method for the amplification of a laser beam by pumping with a homogenous composite source beam through an amplification medium which overcomes at least some of the disadvantages of the prior art.

A further object of at least one embodiment of the present invention is to provide a laser amplifier including a double pumped optically excited single crystalline slab active region in a simpler, more compact arrangement than the prior art.

According to a first aspect of the present invention there is provided apparatus for amplifying a laser beam, comprising:

an amplification medium having a rectangular cross-section providing a first facet with a long edge and a short edge, the long edge being along an x-axis, the short edge being along a y-axis and a z-axis defining a pump axis within a rectangular coordinate system;

and a pump module, the pump module comprising:

a pump beam, the pump beam being a composite of source beams from emitters arranged in a linear array with a slow axis being parallel to the x-axis and a fast axis being parallel to the y-axis;

and an optical assembly located between the emitters and the first facet of the amplification medium;

the optical assembly having:

adjacent the emitters, a first lens in the fast axis configured to act on the pump beam and an array of second lenses in the slow axis, each second lens configured to act on an individual source beam and a third lens, at a spacing from the first and second lenses, configured to act on the pump beam;

wherein the individual source beams overlap at the first facet, are imaged and sized to fill the first facet along the long edge in the slow axis and focussed to a beam size, less than a length of the short edge, in the fast axis;

thereby providing homogenous pumping of the amplification medium and a laser beam passed through the amplification medium in a direction orthogonal to the pump beam will be uniformly amplified.

In this way, optical systems in the fast and slow axis, form a composite pump beam from a linear array of emitters in which all the individual source beams overlap at the facet of the amplification medium creating a Gaussian-like gain profile along the y-axis, and a top hat like profile along the x-axis, being within a near-field high aspect ratio pump beam to give improved homogenous pumping. Additionally, the optical arrangement can be relatively short in length to provide a compact pump scheme.

Preferably, the first lens comprises a fast axis collimator, with a focal length $f_{1y}$, and the third lens comprises a lens with focal length $f_2$, the combination chosen to give the required beam size in the fast axis at the first facet. This beam size will be less than length of the short edge. The fast axis collimator may have a short focal length, with the beam height at the output of the collimator typically being greater than the desired beam height at the entry to the facet. The beam height at the facet may be adjusted by varying the distance between the emitters and the fast axis collimator. More preferably, the third lens is configured to create a Gaussian beam waist of each source beam at or near the first facet. This is achieved by selecting the beam waist position to be a distance $f_2$ from the third lens. Additionally, passage of the fast axis beam through the third lens may provide a means for directing the pump beam by small displacements in the y direction.

Preferably, the second lenses each comprise a slow axis collimator, each having a focal length $f_{1x}$, giving a magnification of $M_x=f_2/f_{1x}$ with the third lens in the slow axis. In this way, with the first facet positioned a distance equal to $f_2$ from the third lens, all the source beams will overlap at the first facet providing a substantially homogenised beam at the first facet. Preferably, the distance between the second lenses and the third lens is less than the sum $f_2+f_{1x}$. This advantageously causes the source beams to have a diverging characteristic as they pass into the amplification medium. Preferably the third lens is configured to direct peripheral source beams into the amplification medium at an angle to create total internal reflection within the amplification medium. This combination of features, acts to ensure that the whole amplification medium is pumped substantially uniformly.

Preferably the third lens is a spherical lens. In this way, the optical assembly can use standard components reducing the cost and simplicity of the design. The third lens may be an equivalent aspheric or Gradium™ lens. Such lenses can be used to reduce possible aberrations.

The first and second lenses may be provided as a single optical element. Such elements are now readily available and use of a single optical element again simplifies the design and eases construction. This single optical element and the third lens advantageously provide a compact optical assembly.

Preferably, the area of the pump beam on the first facet has a length substantially equal to the length of the long edge and a width less than 50% of the length of the short edge. More preferably, the width is 20% to 30% of the length of the short edge. In this way, the amplification medium has a thin pumped sheet with a rectangular cross-section whose dimension in the y-direction is smaller than the dimension of the amplification medium.

Preferably, the linear array of emitters is a laser diode bar. More preferably, there is a plurality of laser diode bars providing a single pump beam within the area of the first facet and wherein the corresponding plurality of optical assemblies have a common third lens. In this way, the energy of the pump beam can be multiplied. Thus preferably, the pump module comprises a plurality of laser diode bars providing the pump beam, each bar including a first lens, each emitter including a second lens and the apparatus having a single third lens configured to act on the pump beam, so that the individual source beams substantially overlap at the first facet and are imaged and sized to fill the first facet.

This plurality of laser diode bars is possible as the distance between the second lenses and the third lens may be sufficient to allow use of mirror(s) to direct the source beams from each laser diode bar to the aperture of the third lens. Other elements such as polarising cubes may be used.

Preferably, the pump module may comprise a first laser diode bar and a second laser diode bar, the second laser diode bar including a linear array of emitters arranged orthogonal to the first laser diode bar with a slow axis being parallel to the z-axis and further comprising a second optical assembly including a mirror to direct the beam towards the common third lens. In this way, a dual diode bar compact pump module is provided.

There may be a third laser diode bar, the third laser diode bar including a linear array of emitters arranged facing the second laser diode bar with a slow axis being parallel to the z-axis and further comprising a third optical assembly including a mirror to direct the beam towards the common third lens. In this way, a triple diode bar compact pump module is provided.

Preferably, there is a further laser diode bar, the further laser diode bar including a linear array of emitters arranged linearly to a first laser diode bar with a slow axis being parallel to the x-axis.

The pump module may comprise a first laser diode bar and a second laser diode bar, the second laser diode bar including a linear array of emitters arranged with a slow axis being parallel to the z-axis and further comprising a second optical assembly including a polarising cube to direct the beam towards the common third lens. In this way, a dual diode bar compact pump module is provided.

The pump module may comprise a first laser diode bar and a second laser diode bar at different wavelengths, the second laser diode bar including a linear array of emitters arranged with a slow axis being parallel to the z-axis and further comprising a second optical assembly including a dichroic mirror to direct the beam towards the common third lens. In this way, a dual diode bar compact pump module is provided.

The plurality of laser diode bars may be stacked in the y-axis. The plurality of laser diode bars may also be staggered in the z-axis.

Preferably, a propagation axis of the laser beam is transverse to the pump axis. In this way, the amplification medium can be side pumped and no optics are required which would need to act on both the pump and laser beams.

There may be a second pump module arranged on an opposite side of the amplification medium, the second side providing second facet being opposite the first facet and orthogonal to the pump axes. In this way the amplification medium is homogenously pumped.

Advantageously, a propagation axis of at least one pump beam is off-axis with respect to the z-axis. This off-axis arrangement prevents opposite pump beams interfering with the optical assemblies.

Preferably, the amplification medium is a single crystalline slab. The amplification medium may be a glass. The amplification medium may be a ceramic. Preferably, the amplification medium is a slab formed in a sandwich structure with a doped medium between two un-doped mediums.

There may be a fourth lens, at a spacing from the third lens, the fourth lens being configured to act on the pump beam in the fast axis so that the beam is sized for coupling into the doped region. Preferably, the fourth lens is cylindrical. In this way the pump beam can be coupled into a waveguide.

According to a second aspect of the present invention there is provided a method of pumping a homogenous composite beam through an amplification medium, comprising the steps:
a) providing a plurality of source beams from emitters arranged in a linear array;
b) providing an optical assembly between the emitters and a first facet of the amplification medium, the optical assembly having a first lens in a fast axis adjacent the emitters to act on the source beams; an array of second lenses, adjacent the first lens, in a slow axis, each second lens configured to act on an individual source beam; and a third lens, at a spacing from the first and second lenses, configured to act on the source beams; and
c) spacing the lenses to overlap the individual source beams upon a first facet of the amplification medium; the individual source beams being imaged and sized to fill the first facet along a long edge of the amplification medium in the slow axis; the individual source beams being focussed to a beam size less than the length of a short edge of the amplification medium in the fast axis; and peripheral source beams undergoing total internal reflection on entering the amplification medium.

Preferably, the linear array of the emitters are from a diode bar.

Preferably, the individual source beams have a beam waist at the first facet. The position of the beam waist relative to the first facet may be varied by adjusting the position of the first lens relative to the first facet.

BRIEF DESCRIPTION OF THE SEVERAL VIEWS OF THE DRAWINGS

Embodiments of the present invention will now be described, by way of example only, with reference to the accompanying drawings of which:

FIGS. 5(a) and 5(b) to 12 are schematic illustrations of apparatus for amplifying a laser beam, shown in (a) the fast axis and in (b) the slow axis in the respective drawings, according to embodiments of the present invention;

DETAILED DESCRIPTION OF THE INVENTION

Figure 3A:
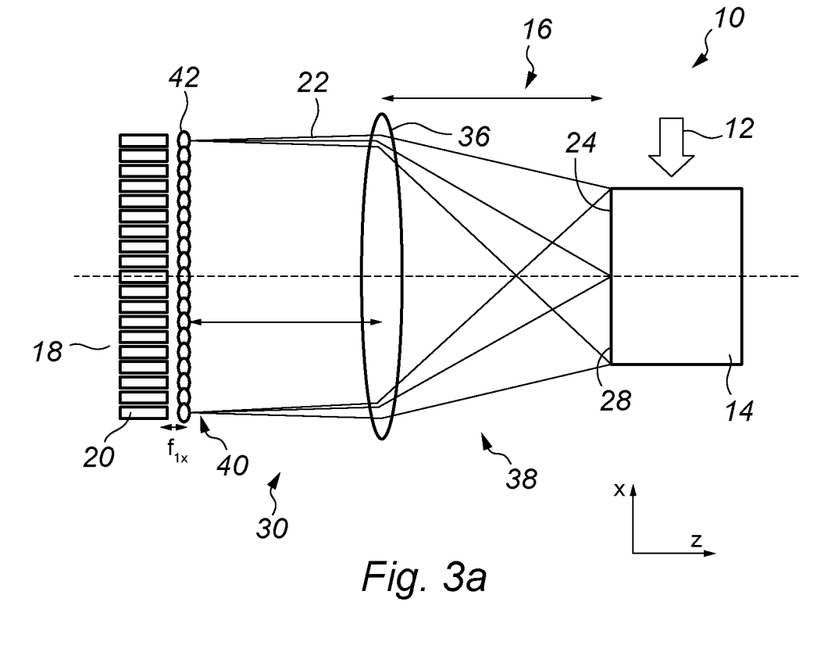
FIGS. 3(a) and 3(b) are schematic illustrations of an apparatus for amplifying a laser beam shown in FIG. 3(a) in the slow axis and in FIG. 3(b) in the fast axis, according to an embodiment of the present invention.
Figure 3B:
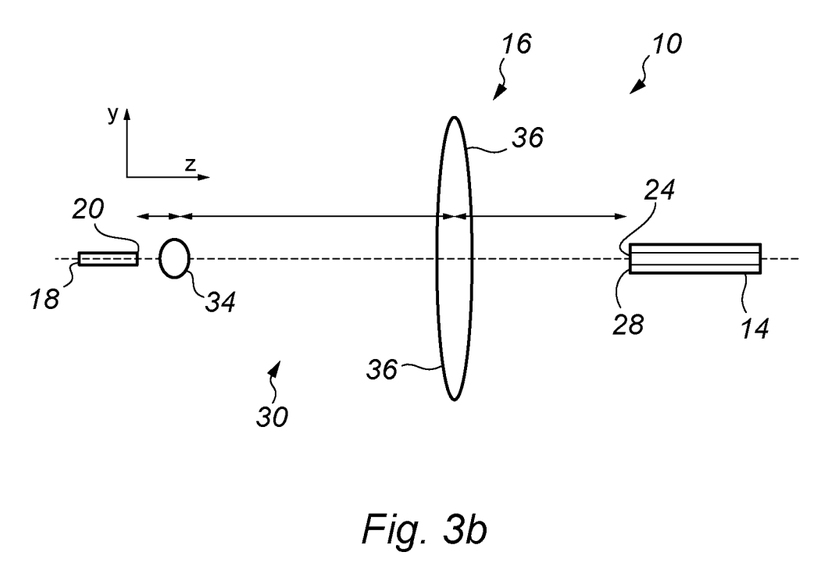

Reference is initially made to FIGS. 3(a) and 3(b) of the drawings which illustrates an apparatus for amplifying a laser beam, generally referred to as a laser amplifier and indicated by reference numeral 10, for amplifying a laser beam 12 through an amplification medium, being a crystal 14, where the crystal 14 is pumped by a pump module 16, according to an embodiment of the present invention. FIGS. 3(a) and 3(b) show two views, with FIG. 3(a) being a top view and FIG. 3(b) being a side view.

Crystal 14 is a solid state medium formed as a single crystalline structure which may be doped in parts as is known in the art. The crystal 14 has a rectangular cross-section, providing a short edge 26 and a long edge 28. This may be referred to as a single crystalline slab. While a crystal is described the amplification medium may be glass or ceramic. Additionally, the slab could be formed in a sandwich structure with a doped medium between two undoped media.

The laser beam 12 is typically generated from a laser source considered as the master oscillator. A low power laser master oscillator generates a laser beam of pulses which are coupled into the laser amplifier 10. Each input pulse stimulates emission within the crystal 14 which is added to the input pulse to create a higher output energy pulse. In this way, the laser amplifier 10 may be considered as a power amplifier and the laser beam may be considered as a seed beam.

For crystal 14 to act as a lasing medium it is required to be pumped from a secondary source. A linear array of emitters provides this secondary source. In this embodiment the secondary source is a diode laser, or more preferably a laser diode bar 18. The laser diode bar 18 is a linear array of semiconductor laser diode emitters 20 arranged along an x-axis, of single row height in the y-axis, and directed so that each emitter 20 outputs a source beam 22 in the z-axis. The emitters 20 are preferably multimode laser emitters. In the Figure only the beams from outer-most diode emitters are shown for clarity. The x,y,z axes define a standard rectangular co-ordinate system, with each axis being orthogonal to the others. The y-axis is referred to as the fast axis, see FIG. 3(b). The fast axis is typically the vertical axis being perpendicular to the semiconductor wafer. In the fast axis, each emitter generates a rapidly diverging Gaussian-like mode. In the slow axis, the x-axis, as shown in FIG. 3(a) and being parallel to the bar 18, the emission from each emitter 20 combines to provide an approximation of a top hat with slow divergence. The source beams 22 thus combine to provide a composite pump beam which is imaged into a first facet 24 of the crystal 14.

In order to image the beams 22 into the crystal 14, an optical assembly 30 is located between the emitters 20 and the rectangular side or first facet 24 of the crystal 14. In the embodiment of FIG. 3 there are nineteen emitters 20 in the laser diode bar 18. The optical assembly 30 comprises a first lens 34, an array of second lenses 40 and a third lens 36. The optical assembly 30 can be considered independently in the fast and slow axis.

Referring now to FIG. 3(a), in the slow axis, the optical assembly 30 shows the array of second lenses 40 and the third lens 36. The second lenses 40 are an array of slow axis collimation lenses 42, with focal lengths $f_{1x}$, which are placed a distance equal to $f_{1x}$ after each emitter 20. Each individual lens 42 will typically be a cylindrical lens which acts on a single emitter source beam 22.

Figures 7A, 7B:
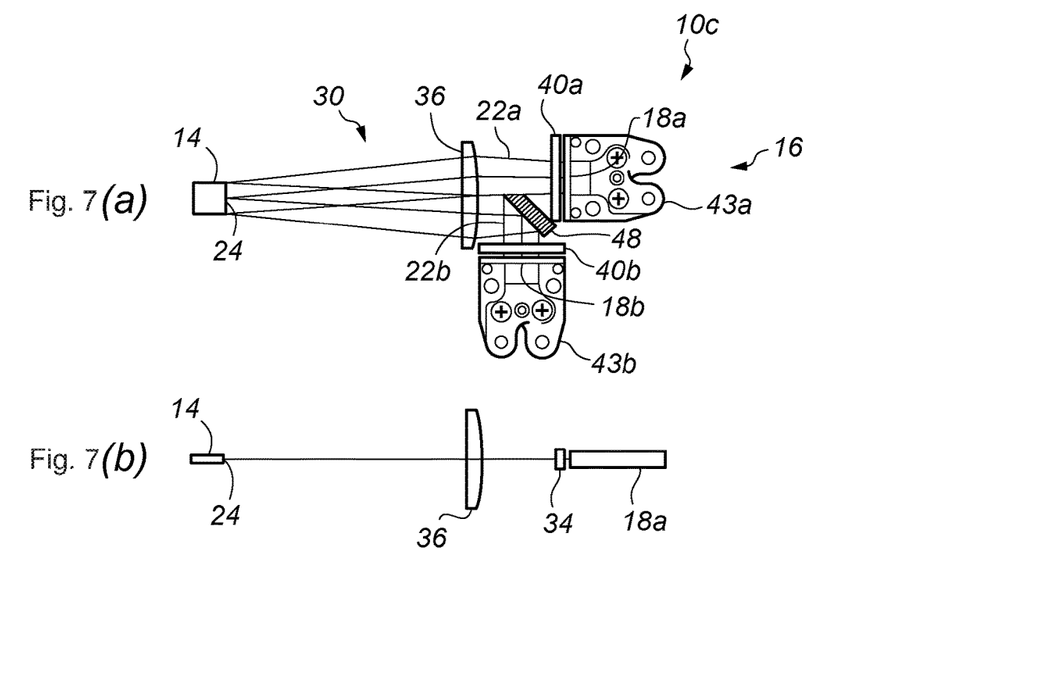

The third lens 36 is spaced a distance $L_1$ from second lenses 40. This distance $L_1$ is not crucial and can be varied to suit other parameters in the design. Indeed $L_1$ can be made sufficient to locate other optical components into the assembly, see FIG. 7, for example. A typical distance for $L_1$ is ~25 mm. The distance between the third lens 36 and first facet 24 is the pump projection distance and is selected as $f_2$, the focal length of the third lens. The lenses 36,40 provide a magnification, $M_x$, $\approx f_2/f_{1x}$. This provides an image of each source beam 22 from each emitter 20 across the full length of the first facet 24. Thus the source beams 22 are entirely overlapped, in the slow axis, on the first facet 24. This technique ensures that the full length of the amplification medium is exposed to a substantially homogenised slow axis beam.

The focal length $f_{1x}$ of the cylindrical lens array of second lens 40 is chosen to provide this magnification. When fast axis collimation is included, the condition also requires the second lenses 40 to be positioned at a physical distance from the emitters 20 that is somewhat larger than $f_{1x}$ to compensate for slow axis refraction that is introduced by the fast axis lens 34. The optical assembly 30 combination of the second and third lenses may be considered as a two-lens telescopic magnifier 38. Such a magnifier 38 may have considerable optical power, e.g. ×70 and can be adapted to match a range of facet sizes and geometries.

Thus the focal lengths of the lenses 36,40 are chosen to give a suitable expansion in the individual source beams 22 so that they overlap the crystal 14 and no regions are left unpumped, in the slow axis. Typically, the emitter 20 width is ~150 μm and the crystal length is ~7 mm requiring a magnification of ~47, typically obtained with $f_{1x}$=1.8 mm and $f_2$=80 mm. Importantly, the magnified images of the emitters are formed at a focal length for the third lens 36 ensuring spatial overlap. Therefore, the spillage of the beam around the crystal is minimised and any spatial variations in the emitter outputs are averaged across the magnified image resulting in homogenous pumping of the crystal 14.

In overlapping the beams, the lenses 36,40 are typically selected so that the distance L1 can be less than the sum $(f_{1x}+f_2)$ causing the source beams 22, passing into the crystal 14 to have a diverging characteristic in the slow axis, which, with the additional effect from total internal reflection of the peripheral source beams entering the crystal 14 at an angle, acts to ensure that the whole crystal 14 is pumped substantially uniformly.

This overlapping also provides some immunity from individual laser diode or laser diode emitter 20 failures. A single emitter failing would reduce the pumping power but would not leave any areas along the slow axis unpumped. This is in contrast to the prior art, where the failure of an individual laser diode or laser diode emitter would result in an unpumped region. In four level laser crystals this could result in unwanted thermal effects. Additionally, in quasi-3-level laser systems, an unpumped region is absorbing thereby introducing loss and lowering the device efficiency.

Now considering to the optical assembly 30 in the fast axis, we refer to FIG. 3(b). The source beams 22 leaving the emitters 20 have a high divergence. Thus the first lens 34 is a fast axis collimator as is known in the art to slow the divergence. Typically, the fast axis collimation has a focal length, $f_{1y}$, between 0.6 mm and 0.9 mm. The fast axis collimator 34 is located a focal length, $f_{1y}$, from the emitters 20 so that each emitter source beam 22 directly enters the first lens 34 of the optical assembly 30. The resultant collimated fast axis beams are usually a good approximation to a Gaussian beam so that the focal length $f_{1y}$ is selected to provide a desired beam height on exiting the collimator, lens 34, of $2w_0$. Standard ABCD matrices can be used to describe the optical arrangement and the ABCD law used to calculate the beam size at points along the optical axis. As there may be aberrations, the beam after the first lens 34 is assigned an appropriate value of $M^2$, typically 1.3, as would be known to those skilled in the art.

The optical assembly in the fast axis also includes the third lens 36. This is a spherical lens and its focal length $f_2$ and position are also controlled by their requirements in the slow axis.

Remembering that the objective is to create a thin gain sheet within the crystal 14, a desired beam height $2w_1$ at the first facet is selected. The beam height $2w_1$ is usually less than $2w_0$. Additionally, it is beneficial for there to be a Gaussian waist at or near the first facet 24, i.e. a waist distance $L_2$ between the third lens and the beam waist should be equal to the pump projection distance which was selected as $f_2$.

To obtain the necessary control of the beam waist position and its size, the ABCD calculations process uses the parameters $w_0$ and $L_1$, which may be varied within practical limits, in combination with the pre-chosen $f_2$. Coupled calculations provide an iterative solution to obtain the most appropriate design.

In the case when the beam waist size or position is not satisfactory, additional cylindrical focussing power in the fast axis may be necessary. One way of obtaining this without introducing an extra optical component is by adjustment of the position of the first lens 34 relative to the emitters 20. This can introduce either a positive or negative wavefront radius of curvature to give an extra degree of freedom in revised ABCD calculations.

For the embodiment described, the third lens 36 has a focal length $f_2$ of typically ~80 mm is placed ~25 mm from the fast axis collimator, first lens 34. The crystal 14 is placed at a distance of $f_2$ from the third lens 36. An emitter source beam 22 radius of ~1 μm will thus give a pumped stripe half-height of ~100 μm formed at the first facet 24 of the crystal 14. The pumped region is an area of the first facet 24 of the crystal 14. The crystal height on the short edge 26 has a typical value between 0.75 mm to 1 mm. The height of the area of the pumped region is ~20% to 30% of the total crystal height on the short edge 26 to provide the thin gain sheet.

Figure 4A:
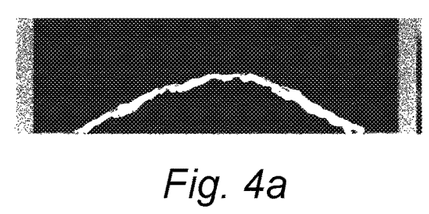
FIGS. 4(a) and 4(b) are illustrations of a beam pump profile of the apparatus of FIGS. 3(a) and 3(b) at the first facet taken in FIG. 4(a) without the optical assembly and in FIG. 4(b) with the optical assembly.
Figure 4B:
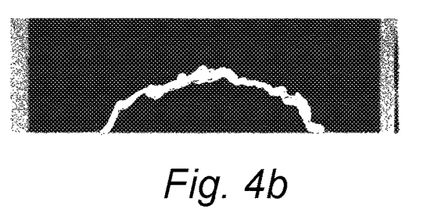

Unlike the prior art of FIG. 1, a near field high aspect ratio beam is created on the crystal 14, with typical aspect ratios >10:1. This is significant as it matches the geometry of the thin slab or planar waveguide structures of the pumped crystal. FIGS. 4(a) and 4(b) demonstrate the effect of using the optical assembly 30 described above. Referring to FIG. 4(a), without imaging, the pump beam profile slowly reduces from the centre towards the edge. In practice, matching this profile to a rectangular laser crystal would result in either unpumped or under pumped zones resulting in absorbing regions towards the edge of the crystal, or significant spillage of pump power beyond the edges of the crystal. Both situations would result in an inefficient device. However, by imaging the individual emitter source beams and spatially over lapping them the pump beam profile has much sharper edges. This is shown in FIG. 4(b). This allows a much closer match between the pump beam profile and the laser crystal resulting in efficient, near uniform pumping of the laser crystal with minimal loss of pump power.

Figures 5A, 5B:
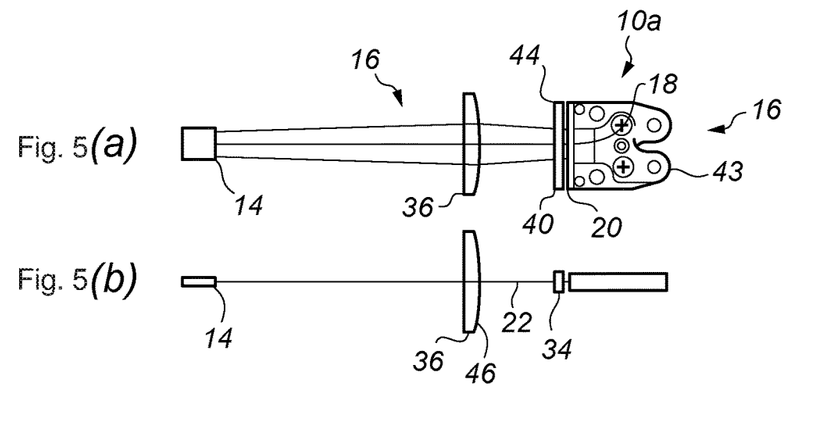

An alternative embodiment of a laser amplifier 10a, including a pump module 16 using a single laser diode bar 18 is shown in FIGS. 5(a) and 5(b). Like parts to those of the laser amplifier of FIG. 3 have been given the same reference numeral to aid clarity and the fast axis and slow axis views are provided.

In FIGS. 5(a) and 5(b), the mount 43 for the laser diode bar 18 is shown to indicate the space required for a laser diode bar 18 in the laser amplifier 10a. In this embodiment, the fast and slow axis collimators 34,40 are provided as a single optical element 44 mounted in front of the emitters 20 at the output source beams 22 of the emitters 20. The third lens 36 is plano-convex. The slow axis collimators 40 are therefore individually aligned to direct each emitter source beam 22 to a desired position on the convex face 46 so that it will be imaged into the area of the pumping region of the crystal 14.

The input pump power to the crystal 14, therefore the available gain in the amplifier 10,10a, is limited by the available power per diode bar 18. To scale the power further a number of diode bars 18 can be combined within a single pump module 16. The distance L1 may be made sufficient to allow this, with each array of source beams 22 from each laser diode bar 18 sharing the aperture of the third lens 36.

Figures 6A, 6B:
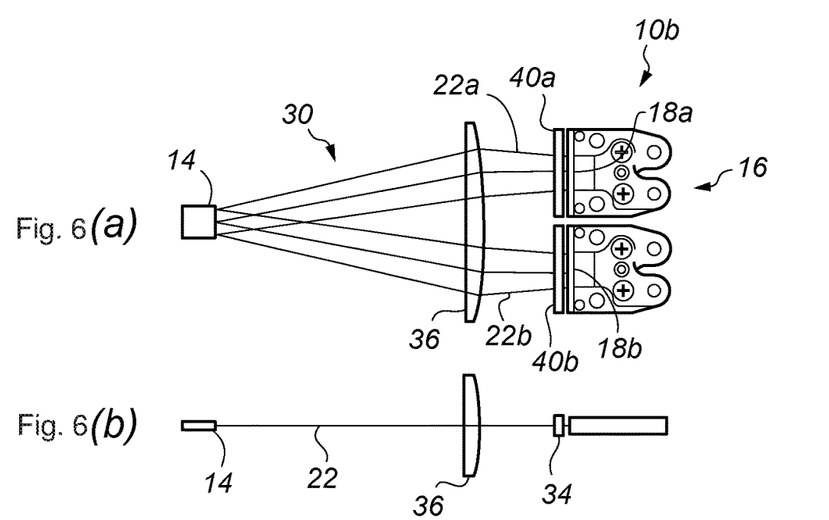

FIGS. 6(a) and 6(b) shows laser amplifier 10b with a two bar 18a,b side-by-side lay out for doubling the potential power from a pump module 16. In the optical assembly 30 each bar 18a,b has a fast axis collimator 34a,b as the first lens and an array of slow axis collimators 40a,b as the second lenses. The emitter source beams 22a,b overlap in slow axis at the crystal 14 by the action of the third lens 36. This technique produces the required power scaling but with an enlarged footprint.

Referring to FIGS. 7(a) and 7(b) there is illustrated a laser amplifier 10c which shows an approach to reduce the two-bar pump module 16 of FIG. 6 towards the footprint of a single bar pump module. The diode bars 18a,b are again in the same plane but one diode bar 18b is rotated to a transverse direction to the second diode bar 18a. A mirror 48 is located at 45 degrees to the slow axis on the diode bar 18b to reflect the transverse emitter source beams 22b along a parallel path to the emitter source beams 22a of the second diode bar 18a. The mirror 48 is located in front of the mount 43a but clear of the emitter source beams 22a. This reduces the footprint of the laser amplifier 10c and also the required diameter of the third lens 36.

Figures 8A, 8B:
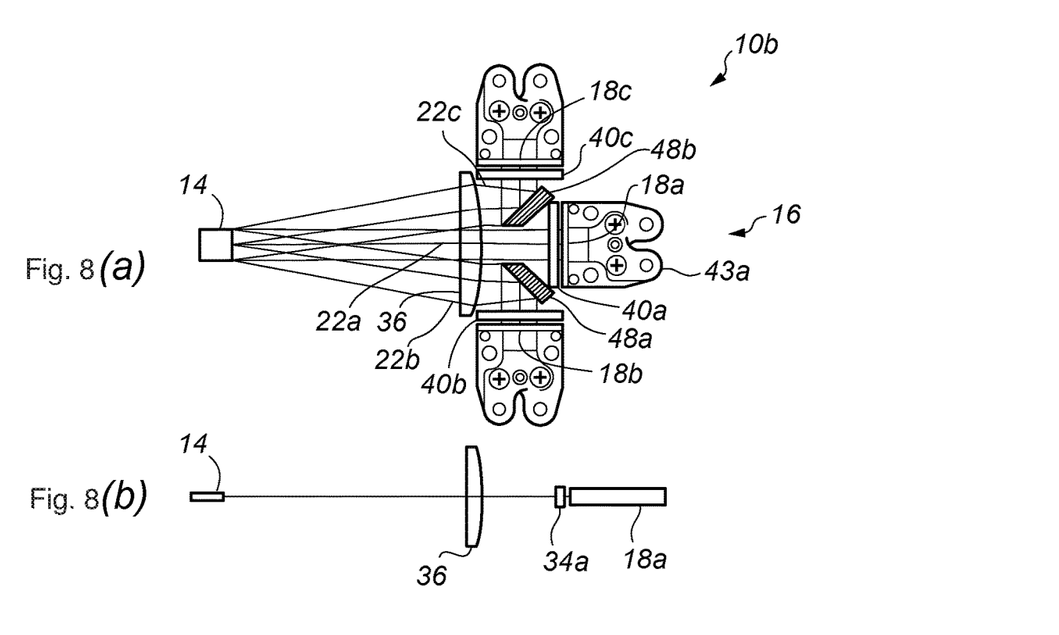

This approach can be easily extended to three and four diode bars, as shown in FIGS. 8(a), 8(b), 9(a) and 9(b). In FIGS. 8(a) and 8(b), the laser amplifier 10d has a third diode bar 18c which is located transverse to the second diode bar 18a and opposite the first diode bar 18b of the arrangement of FIGS. 7(a) and 7(b). A second mirror 48b is located at 45 degrees to the slow axis on the third diode bar 18c to reflect the transverse emitter source beams 22c along a parallel path to the emitter source beams 22a of the second diode bar 18a. The mirror 48b is located in front of the mount 43a but clear of the emitter source beams 22a.

Figure 9A:
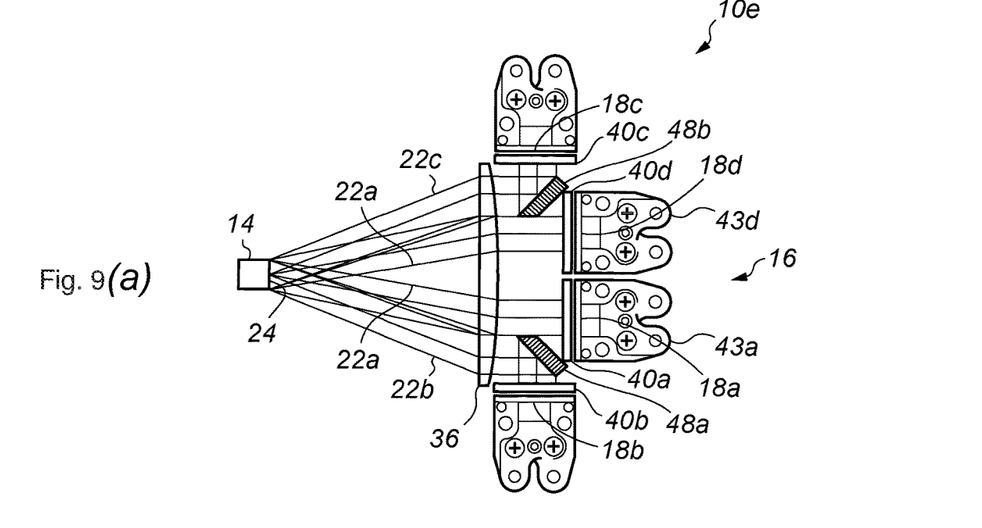
Figure 9B:
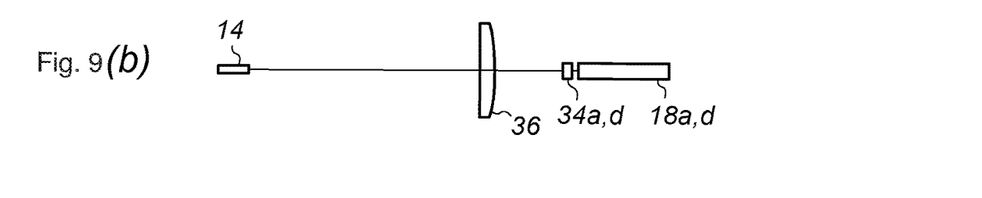

In FIGS. 9(a) and 9(b), the laser amplifier 10e may be considered as a doubling of the laser amplifier 10c of FIGS. 7(a) and 7(b) while still using a common third lens 36 in the optical assembly 30. The third lens 36 is spherical to give the same focal length in the fast and slow axes for imaging the emitters of each laser diode bar onto the facet 24 of the crystal 14. The fourth laser diode bar 18d is in a side-by-side arrangement to the second laser diode bar 18a as for the laser amplifier 10b of FIGS. 6(a) and 6(b). The first diode bar 18a is transverse to the second laser diode bar 18b and the third laser diode bar 18c is transverse to the fourth laser diode bar 18d, with the second laser diode bar 18b and the third laser diode bar 18c facing each other. The first mirror 48a is located at 45 degrees to the slow axis on the diode bar 18b to reflect the transverse emitter source beams 22b along a parallel path to the emitter source beams 22a,22d of the second diode bar 18a and the fourth diode bar 18d. The first mirror 48a is located in front of the mount 43a but clear of the emitter source beams 22a. The second mirror 48b is located at 45 degrees to the slow axis on the third diode bar 18c to reflect the transverse emitter source beams 22c along a parallel path to the emitter source beams 22a,22d of the second diode bar 18a and the fourth diode bar 18d. The second mirror 48b is located in front of the mount 43d of the fourth laser diode bar 18d but clear of the emitter source beams 22d.

Figure 10A:
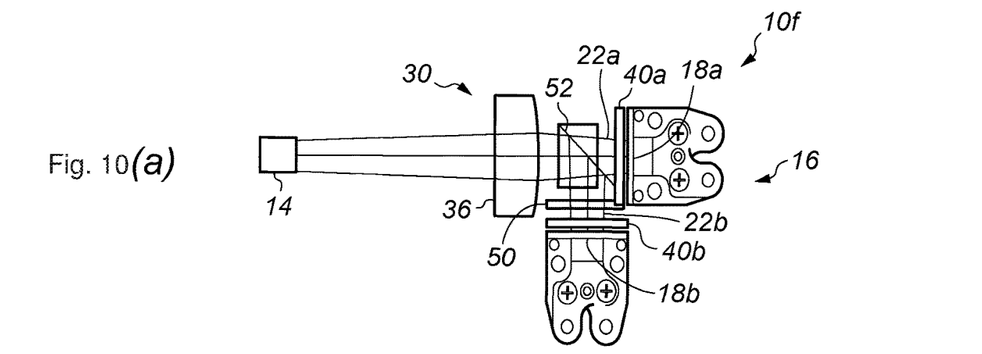
Figure 10B:
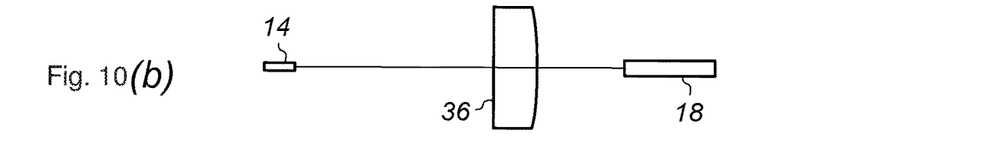

Ultimately, scaling using this approach is limited only by the practical aperture of the third lens 36. Where two laser diode bars are arranged transverse to each other, a more compact pump module 16 is possible by using a polarisation combining scheme in place of the mirror 48. Referring now to FIGS. 10(a) and 10(b) there is illustrated a laser amplifier 10f in which the optical assembly 30 uses a half-wave plate 50 to rotate the polarisation of the transverse diode bar 18b emitter source beams 22*b* by 90 degrees compared to the second diode bar 18*a* emitter source beams 22*a*. A polarising cube 52 is located in the beam path between the optical element 40*a* and the third lens 36. The emitter source beams 22*a* from the second diode bar 18*a* are transmitted through the polarising cube 52 whilst the transverse diode bar 18*b* emitter source beams 22*b* are reflected to be co-linear with emitter source beams 22*a*. The emitter source beams 22*a*, 22*b* after the polarising cube 52 exactly overlap reducing the required footprint of the pump module 16 and the aperture of the third lens 36. This can be readily extended to a number of diode bars.

Alternatively, the polarising cube 52 is replaced by a dichroic mirror and the half-wave plate 50 is removed. Diode bar 18*a* operates at a first wavelength with high transmission through the dichroic mirror. Diode bar 18*b* operates at a second wavelength with high reflection from the dichroic mirror. The operational wavelengths of both diode bar 18*a* and diode bar 18*b* have high absorption in crystal 14 ensuring efficient pumping. The required footprint of the pump module 16 and the aperture of the third lens 36 are reduced. This can be readily extended to a number of diode bars.

Figures 11A, 11B:
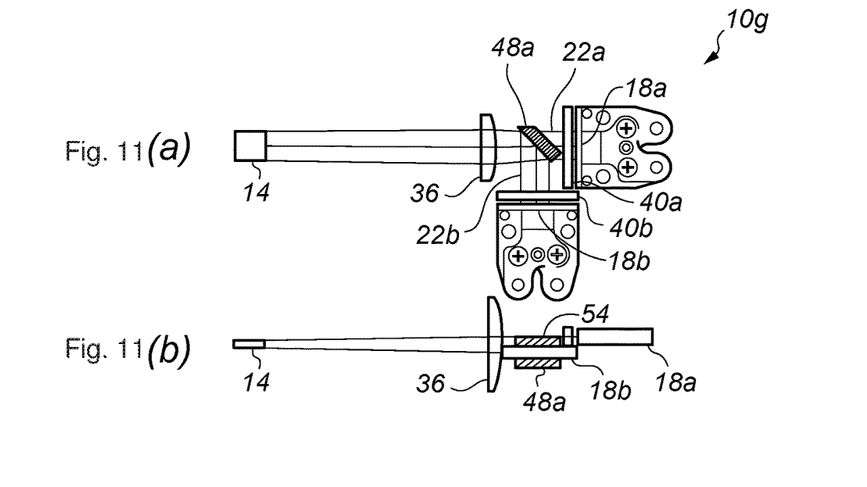
Figure 12:
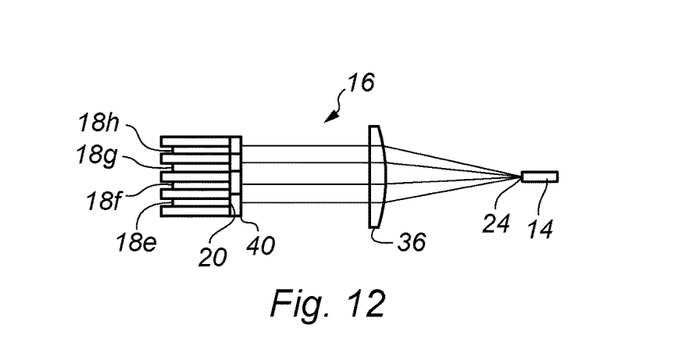

While the laser amplifiers 10*a-f* have laser diode bars arranged in a single plane, non-planar scaling techniques are also possible. Referring to FIGS. 11(*a*) and 11(*b*) there is illustrated a laser amplifier 10*g* having two laser diode bars 18*a*,18*b* arranged transverse to each other. As seen in the lower fast axis side view, the transverse diode bar 18*b* is located in a plane slightly below or under the second laser diode bar 18*a*. A mirror 48*a* is located at 45 degrees to the slow axis of the diode bar 18*b* to reflect the transverse emitter source beams 22*b* along a substantially parallel path to the emitter source beams 22*a* of the second diode bar 18*a*. The mirror 48*a* has a height so that the emitter source beams 22*b* from the transverse diode bar 18*b* are reflected from the mirror 48*a* whilst the emitter source beams 22*a* from the second diode bar 18*a* skim the top 54 of the mirror 48*a*. The second lens 36 acts to focus the two sets of emitter source beams 22*a*,22*b* in the fast axis into a line at the crystal 14. A uniform stacked arrangement of laser diode bars 18*e-h* could also be used. This is illustrated in FIG. 12. A two-dimensional array of emitters 20 is provided which can be used in place of the linear array of emitters in the individual diode bars 18*e-h* of the embodiments described hereinbefore.

In FIGS. 3(*a*) and 3(*b*), and 5(*a*) and (b) to 12, laser amplifiers 10,10*a-g* are shown with a pump module 16 providing a pump beam to one facet 24 of the crystal 14. In a preferred embodiment the laser beam 12 is propagated through the crystal 14 on a propagation axis transverse to the pump axis (z-axis). This is in contrast to the INNOSLAB arrangement of the prior art and advantageously removes the requirement of an optical element, typically a polarising cube, at either side of the crystal 14 to separate the pump beam and the laser beam.

Figure 13:
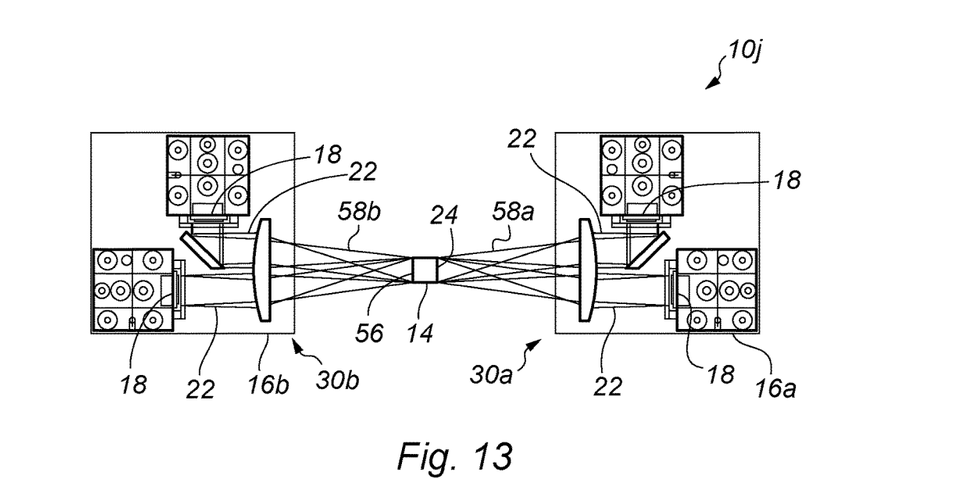
FIG. 13 is a schematic illustration of an apparatus for amplifying a laser beam including two pump modules according to an embodiment of the present invention.

After the pump beam enters the crystal it is absorbed according to Beers Law. If this absorption process is not carefully managed an exponential gain and temperature profile within the crystal can result. Since the crystal is pumped transverse to the axis of propagation of the amplified or oscillating laser beam 12, severe beam steering or modal distortion can occur. To mitigate against these effects the beam is double side pumped, and the dopant level and length of crystal in the pump direction (z-axis) are carefully chosen. A double side pumped laser amplifier 10*j* is shown in FIG. 13. A first pump module 16*a* is located on a first facet 24 of the crystal 14, as described hereinbefore with reference to FIG. 7. A second pump module 16*b* is located at the opposing side 56 of the crystal 14. The laser diode bars 18 of the pump modules 16*a,b* are arranged so that their emitter source beams 22, each form a pump beam 58*a,b*, at the crystal 14 which are within the same plane and each of the pump beams 58*a,b* overlap within a thin stripe inside the crystal after passing through their respective optical assemblies 30*a,b*. The first and second pump modules 16*a,b* are identical to provide the same pump power and pump beam profile at opposite sides 24,56 of the crystal. While the pump modules 16*a,b* are those of laser amplifier 10*c*, shown in FIGS. 7(*a*) and 7(*b*), the pump modules of any embodiment of the present invention could be used. By double side pumping the two pump profiles add incoherently reducing the effect of the exponential decay. Further reduction is possible whilst ensuring suitable laser efficiency by optimising the absorption of the crystalline medium so that ~70% to 80% of the pump beam is absorbed from each pump module 16*a,b*.

Figure 14:
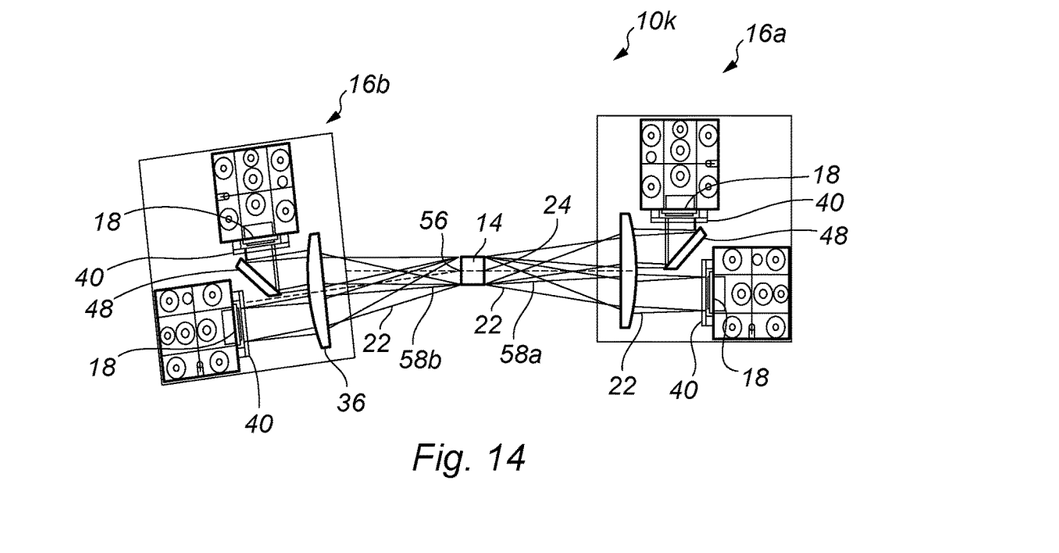
FIG. 14 is the apparatus of FIG. 13 now with an inclined pumping geometry according to a further embodiment of the present invention.

A further embodiment of the double side pumping arrangement is shown in FIG. 14. Like parts to those of the arrangement of FIG. 13 have been given the same reference numeral to aid clarity. The beam propagation axis of pump module 16*b* is now inclined at angle α to the laser crystal pump axis. Preferably, angle α is the range 0 degrees to 20 degrees. The beam axis of pump module 16*a* is collinear with the laser crystal pump axis. The relative inclination of the pump modules 16*a,b* prevents the pump beams striking the pump module emitter facets and causing premature failure whilst uniform pumping is maintained. In a further embodiment, the beam propagation axis of pump module 16*a* can also be inclined with respect to the laser crystal pump axis.

As the laser diode bar is physically separated from the crystal by the optical assembly this allows pumping of the crystal at an angle to the pump facets. When double side pumping, this is particularly useful as any unabsorbed power can be spatially separated from the laser diode facets on the opposing side. If the laser diodes outputs are not isolated the reliability of the emitters may be compromised with an associated reduction in lifetime.

As an alternative to tilting the pump modules 16*a,b*, the pump beam may be directed to provide small displacements in the y direction. The passage of the fast axis beam through the third lens provides the means for directing the beam.

It may also be beneficial that the crystal 14 has weakly tilted facets 24,56 to prevent unwanted internal laser oscillation when it is used as an amplifier.

Figure 15:
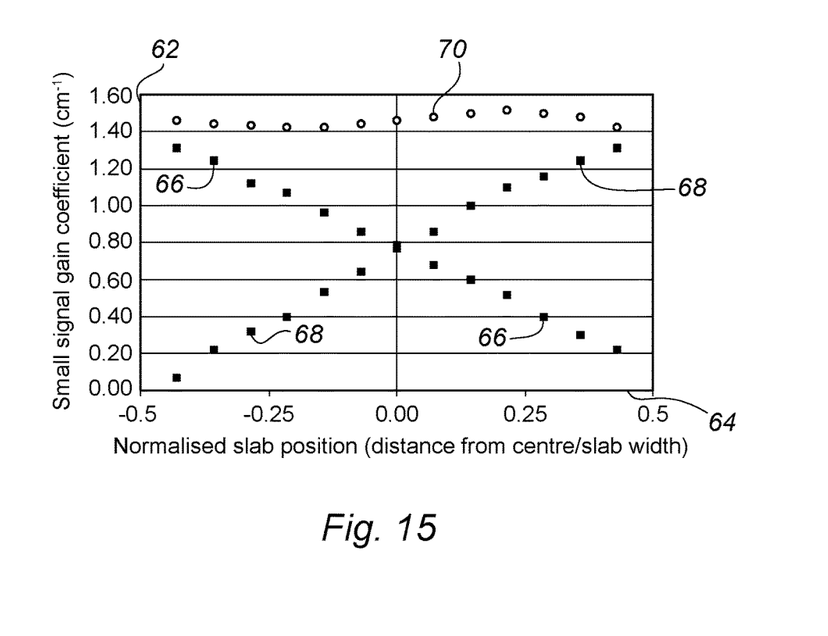
FIG. 15 is a graph of the small signal gain coefficient uniformity across the amplification medium under the pumping conditions of the apparatus of FIG. 14.

By analysing the resultant fluorescence from the laser crystal when double side pumped using the arrangement of FIG. 14, the central pumped region of the crystal is highly uniform along the x-axis, and near Gaussian along the y-axis. FIG. 15 shows a graph of the small signal gain coefficient measurement 62 against the propagation direction of the amplified beam, given as a normalised slab position 64 i.e. the distance from the centre divided by the slab width, for three different pump configurations. Points 66 represent pumping from a single module and shows that with only one of the modules pumping the crystal the small signal gain coefficient decreases away from the input pump edge of the crystal, as expected from Beers Law. Points 68 also represent pumping from a single module, but located at an opposite side of the crystal, and again show that the small signal gain coefficient decreases away from the input pump edge of the crystal. This would create pump dependent beam steering, thermal stresses and a zone of low population inversion that could be absorbing at low pump powers. Points 70 on the graph represent the case when both pump modules are operating and the crystal is double side pumped. Points 70 show that the small signal gain coefficient is nearly invariant across the width of the laser crystal, as would be expected from the fluorescence profile. The high uniformity ensures minimal thermal effects and uniform inversion.

The laser amplifier described herein can be used on a single pass laser beam. Alternatively, the laser beam can be within a multi-pass amplifier arrangement such as the pre- and power amplifier described in GB2505315 to the present Applicants. GB2505315 is incorporated herein by reference and describes an optical amplifier which integrates a pre-amplifier and a power amplifier in a single rectangular active medium to enable amplification of low power ultra-short pulses to optimal power levels. A laser beam passes through the amplification medium along a first pre-amplification path making multiple traverses of the medium. It is imaged back along the first path to make a double pass of the medium as a pre-amplifier. The beam is then re-imaged into the medium again on a second power amplification path, making multiple traverses of the medium in a single pass. The paths are independent but overlap so that efficient power extraction is achieved. Using the laser amplifier of the present invention, the single rectangular active medium is the laser crystal described herein being pumped from pump modules including one or more laser diode bars whose emitters are imaged onto one or opposing surfaces of the crystal via optical assemblies with pump axes transverse to the propagation direction of the laser beam, according to embodiments of the present invention.

The principle advantage of the present invention is that it provides an apparatus and method for amplifying a laser beam in which overlapping of source beams, sized to fill the amplification media via a simple optical assembly provides a near-field, high aspect ratio pump beam for homogenous pumping of amplification medium such as the crystal in a MOPA.

A further advantage of at least one embodiment of the present invention is that it provides an apparatus and method for amplifying a laser beam which can be power scaled simply by coupling multiple emitters through the same optical systems.

A yet further advantage of at least one embodiment of the present invention is that it provides an apparatus and method for amplifying a laser beam which provides redundancy in that a failed emitter will not cause a region of the amplification medium to be unpumped and the apparatus is serviceable in that it has few components which may all be replaced easily.

A still further advantage of at least one embodiment of the present invention is that it provides an apparatus and method for amplifying a laser beam which provides a laser amplifier including a double pumped optically excited single crystalline slab active region in a simpler, more compact arrangement than the prior art.

It will be appreciated by those skilled in the art that modifications may be made to the invention herein described without departing from the scope of the invention as defined in the claims. For example, the power scaling techniques are representative of those which could be employed with the optical assembly and those skilled in the art will recognise that other arrangements are possible. While a single lens is shown for the third lens, it will be appreciated that a pair of lenses may be substituted. While a facet of an amplification medium has been described the technique may be applied to provide optimal coupling into a waveguide, which would require the lens pair.

The invention claimed is:

1. Apparatus for amplifying a laser beam, comprising:
   an amplification medium having a rectangular cross-section providing a first facet with a long edge and a short edge, the long edge being along an x-axis, the short edge being along a y-axis and a z-axis defining a pump axis within a rectangular coordinate system;
   and a pump module, the pump module comprising:
   a pump beam, the pump beam being a composite of source beams from emitters arranged in a linear array with a slow axis being parallel to the x-axis and a fast axis being parallel to the y-axis;
   and an optical assembly located between the emitters and the first facet of the amplification medium;
   the optical assembly having:
   adjacent the emitters, a first lens in the fast axis configured to act on the pump beam, an array of second lenses in the slow axis, each second lens configured to act on an individual source beam and a third lens, at a spacing from the first and second lenses, configured to act on the pump beam;
   wherein the individual source beams overlap at the first facet, are imaged and sized to fill the first facet along the long edge in the slow axis and focussed to a beam size less than the length of the short edge in the fast axis;
   thereby providing homogenous pumping of the amplification medium and a laser beam passed through the amplification medium in a direction orthogonal to the pump beam will be uniformly amplified.

2. Apparatus as claimed in claim 1 wherein the first lens comprises a fast axis collimator, with a focal length $f_{1y}$, and the third lens comprises a lens with focal length $f_2$, the combination chosen to give the beam size in the fast axis at the first facet.

3. Apparatus as claimed in claim 2 wherein the second lenses each comprise a slow axis collimator, each having a focal length $f_{1x}$, giving a magnification of $M_x = f_2/f_{1x}$ with the third lens in the slow axis.

4. Apparatus as claimed in claim 2 wherein the third lens is spherical.

5. Apparatus as claimed in claim 1 wherein the first and second lenses are provided as a single optical element.

6. Apparatus as claimed in claim 1 wherein the third lens is configured to create a beam waist of each source beam ahead of the first facet.

7. Apparatus as claimed in claim 1 wherein the third lens is configured to direct peripheral source beams into the amplification medium at an angle to create total internal reflection within the amplification medium.

8. Apparatus as claimed in claim 1 wherein the linear array of emitters is a laser diode bar.

9. Apparatus as claimed in claim 8 wherein the pump module comprises a plurality of laser diode bars each providing a pump beam, each laser diode bar including a first lens, each emitter including a second lens and the apparatus having a single third lens configured to act on the pump beams, wherein the individual source beams overlap at the first facet, are imaged and sized to fill the first facet along the long edge in the slow axis and focussed to a beam size less than the length of the short edge in the fast axis.

10. Apparatus as claimed in claim 1 wherein the optical assembly includes one or more mirrors to direct the source beams to the third lens.

11. Apparatus as claimed in claim 1 wherein the optical assembly includes one or more polarising cubes to direct the source beams to the third lens.

12. Apparatus as claimed in claim 1 wherein there is a second pump module arranged on an opposite side of the amplification medium, the second pump module providing a second pump beam with individual source beams overlapping at a second facet, opposite the first facet, which are imaged and sized to fill the second facet along the long edge in the slow axis and focussed to a beam size less than the length of the short edge in the fast axis, thereby providing homogenous pumping of the amplification medium and a laser beam passed through the amplification medium in a direction orthogonal to the pump beams will be uniformly amplified.

13. Apparatus as claimed in claim 12 wherein a propagation axis of at least one pump beam is off-axis with respect to the z-axis.

14. Apparatus as claimed in claim 1 wherein the amplification medium is a single crystalline slab.

15. Apparatus as claimed in claim 14 wherein the amplification medium is a glass.

16. Apparatus as claimed in claim 14 wherein the amplification medium is a ceramic.

17. Apparatus as claimed in claim 14 wherein the single crystalline slab is formed in a sandwich structure with a doped medium between two un-doped mediums.

18. Apparatus as claimed in claim 15 wherein the amplification medium is a glass slab formed in a sandwich structure with a doped medium between two un-doped mediums.

19. Apparatus as claimed in claim 16 wherein the amplification medium is a ceramic slab formed in a sandwich structure with a doped medium between two un-doped mediums.

20. A method of pumping a homogenous composite beam through an amplification medium, comprising the steps:

(a) providing a plurality of source beams from emitters arranged in a linear array;

(b) providing an optical assembly between the emitters and a first facet of the amplification medium, the optical assembly having a first lens in a fast axis adjacent the emitters to act on the source beams; an array of second lenses, adjacent the first lens, in a slow axis, each second lens configured to act on an individual source beam; and a third lens, at a spacing from the first and second lenses, configured to act on the source beams; and (c) spacing the lenses to overlap the individual source beams upon the first facet of the amplification medium; the individual source beams being imaged and sized to fill the first facet along a long edge of the amplification medium in the slow axis; the individual source beams being focussed to a beam size less than a length of a short edge of the amplification medium in the fast axis; and peripheral source beams undergoing total internal reflection on entering the amplification medium.

21. A method as claimed in claim 20 wherein the linear array of the emitters are from a diode bar.

22. A method as claimed in claim 20 wherein the individual source beams have a beam waist at the first facet.

23. A method as claimed in claim 20 wherein the individual source beams have a beam waist and the position of the first lens relative to the emitters is adjusted to vary the position of the beam waist relative to the first facet.

24. Apparatus as claimed in claim 17 wherein a fourth lens, at a spacing from the third lens, is configured to act on the pump beam in the fast axis and the pump beam is sized for coupling into the doped region.

25. Apparatus as claimed in claim 24 wherein the fourth lens is cylindrical.

\* \* \* \* \*